(12) United States Patent
Lee et al.

(10) Patent No.: US 7,732,814 B2
(45) Date of Patent: Jun. 8, 2010

(54) LIQUID CRYSTAL DISPLAY DEVICE AND METHOD OF FABRICATING THE SAME

(75) Inventors: Na-Kyung Lee, Seoul (KR); Sung-Lim Nam, Seoul (KR)

(73) Assignee: LG Display Co., Ltd., Seoul (KR)

( * ) Notice: Subject to any disclaimer, the term of this patent is extended or adjusted under 35 U.S.C. 154(b) by 365 days.

(21) Appl. No.: 11/455,688

(22) Filed: Jun. 20, 2006

(65) Prior Publication Data

US 2007/0085079 A1 Apr. 19, 2007

(51) Int. Cl.
*H01L 29/04* (2006.01)

(52) U.S. Cl. .............. 257/59; 257/57; 257/72; 257/83; 257/257; 257/290; 257/351; 257/368; 257/392; 257/E27.132; 257/E31.097; 257/E27.1; 257/E29.117; 349/155; 349/156

(58) Field of Classification Search .......... 257/59, 257/72, 83, 257, 290, 351, 368, 392, E27.132, 257/E27.1, E31.097, E29.117; 349/155, 349/156
See application file for complete search history.

(56) References Cited

U.S. PATENT DOCUMENTS

| | | | | |
|---|---|---|---|---|
| 2004/0195573 | A1* | 10/2004 | Kim | 257/72 |
| 2005/0046777 | A1* | 3/2005 | Moon | 349/149 |
| 2005/0088606 | A1* | 4/2005 | Ashizawa et al. | 349/156 |
| 2006/0028598 | A1* | 2/2006 | Lee et al. | 349/107 |

* cited by examiner

*Primary Examiner*—Wael Fahmy
*Assistant Examiner*—Marc Armand
(74) *Attorney, Agent, or Firm*—Morgan Lewis & Bockius LLP

(57) ABSTRACT

A liquid crystal display (LCD) device includes a gate line and a data line crossing each other to define a pixel region on a first substrate, a thin film transistor connected to the gate line and the data line, a first protrusion and a second protrusion formed on the first substrate, a pixel electrode connected to the thin film transistor in the pixel region, a first patterned spacer and a second patterned spacer formed on a second substrate facing the first substrate, wherein the first patterned spacer corresponds to the first protrusion, and the second patterned spacer corresponds to the second protrusion.

11 Claims, 19 Drawing Sheets

Back light

LIQUID CRYSTAL DISPLAY DEVICE AND METHOD OF FABRICATING THE SAME

The present application claims the benefit of Korean Patent Application No. 2005-0097990 filed in Korea on Oct. 18, 2005, which is hereby incorporated by reference.

BACKGROUND OF THE INVENTION

1. Field of the Invention

The present invention relates to a liquid crystal display (LCD) device, and more particularly, to an LCD device including a patterned spacer and a method of fabricating the same.

2. Discussion of the Related Art

Recently, LCD devices have been widely utilized because of thin profile, light weight and low power consumption. Among them, an active matrix LCD device, which has thin film transistors and pixel electrodes arranged in a matrix form to provide high resolution and superiority in displaying moving images, is the subject of significant research and development. The LCD device typically includes a first substrate, a second substrate, and a liquid crystal layer that is interposed between the first and second substrates. The first substrate, also referred to as an array substrate, further includes a thin film transistor (TFT) and a pixel electrode. The second substrate, also referred to as a color filter substrate, further includes a color filter and a common electrode.

FIG. 1 is a schematic perspective view of an LCD device according to the related art. As shown in FIG. 1, an LCD device 1 includes a first substrate 10 and a second substrate 20 that face each other, and a liquid crystal layer 30 that is interposed between the first and second substrates 10 and 20. The first substrate 10 further includes a plurality of gate lines 13, a plurality of data lines 15, a TFT Tr and a pixel electrode 17. The plurality of gate and data lines 13 and 15 are arranged crossing each other, thereby defining a pixel region P. The TFT Tr is formed at a crossing portion of the gate and data lines 13 and 15. The pixel electrode 17 is formed on the pixel region P and connected to the TFT Tr. The second substrate 20 further includes a color filter 23, a common electrode 27 and a black matrix (not shown). Moreover, a seal pattern (not shown) is utilized to seal edges of the first and second substrates 10 and 20, and a plurality of ball spacers (not shown) are arranged between the first and second substrates 10 and 20, thereby spacing the first substrate 10 apart from the second substrate 20. In other words, the first and second substrates 10 and 20 are bonded with the seal pattern at the edges and have the ball spacers sandwiched in-between. Then, the liquid crystal layer is thus formed in a space created by the ball spacers. The plurality of ball spacers each have a spherical shape and are dispersed onto either the first substrate 10 or the second substrate 20. However, the plurality of ball spacers are apt to gather close to each other, thereby making it difficult to evenly disperse the plurality of ball spacers. Also, disposing the plurality of ball spacers in the pixel region P may cause a light leakage. To resolve the above-mentioned problems, a patterned spacer is suggested. The patterned spacer may be fixed either to the array substrate 10 or the color substrate 20.

FIG. 2. is a plane view of an LCD device having the patterned spacer according to the related art. As shown in FIG. 2, a gate line 43 and a data line 55 are formed on the first substrate 40 and cross each other to define a pixel region P. In the pixel region P, a TFT Tr and a pixel electrode 67 are formed. The TFT Tr includes a semiconductor layer 50, a gate electrode 45, a source electrode 58 and a drain electrode 60. The gate electrode 45 is connected to the gate line 43, and the source electrode 58 is connected to the data line 55. The drain electrode 60 is spaced apart from the source electrode 58 and is connected to the pixel electrode 67 through a drain contact hole 65. The pixel region P includes three sub-pixel regions, which are corresponding to three sub-color filters (not shown) of the color filter layer (23 of FIG. 1), respectively. The plurality of patterned spacers 83 are arranged on the array substrate 40 such that they are separated from each other. The array substrate 40 and the second substrate (20 of FIG. 1) are attached with a gap created by the plurality of patterned spacers 83. It can be understood that the plurality of patterned spacers 83 are formed on the gate line 43, not in an active region AA consisting of a plurality of pixel regions P, thereby preventing light leakage.

FIG. 3 is a cross-sectional view of the related art LCD device, taken along the line III-III of FIG. 2. As shown in FIG. 3, the gate electrode 45 and the gate line 43 are formed on the first substrate 40, and a gate insulating layer 47 is formed on the gate electrode 45 and the gate line 43. The semiconductor layer 50 consists of an active layer 50a and an ohmic contact layer 50b and is formed corresponding to the gate electrode 45 on the gate insulating layer 47. The source electrode 58 and the drain electrode 60 are formed on the semiconductor layer 50 such that they are spaced apart from each other and respectively connected to the ohmic contact layer 50b. Also, a passivation layer 63 having the drain contact hole 65 is formed on the source and drain electrodes 58 and 60, and the pixel electrode 67 is formed on the passivation layer 63 and connected to the drain electrode 60 through the drain contact hole 65. A black matrix 73, the color filter layer 76 and a common electrode 79 are sequentially formed on a second substrate 70 facing the first substrate 40. Specifically, the black matrix 73 having a plurality of openings is formed on the second substrate 70, and then the color filter layer 76 is formed on the black matrix 73 and covers the plurality openings. As shown in both of FIGS. 2 and 3, the color filter layer 73 includes three sub-color filters 76a, 76b and 76c of red, green and blue colors. The common electrode 79 is formed of a transparent material and covers the color filter layer 73.

A plurality of patterned spacer 83 are arranged apart from each other between the common electrode 79 of the second substrate 70 and the passivation layer 63 of the first substrate 40. In other words, the plurality of patterned spacers 83 are connected to the common electrode 79 and the passivation layer 63. Then, the liquid crystal layer 90 is thus interposed between the first and second substrates 40 and 70. Herein, the plurality of patterned spacer 83 are formed on the second substrate 70 because a process of fabricating the second substrate 70 is less complicated than that of fabricating the first substrate 40. However, when the related art LCD device having the patterned spacer 83 is erect under a high temperature ambience, since an expansion rate of the patterned spacer 83 is less than that of the liquid crystal layer 90 and an expansion rate of the first and second substrates 40 and 70, the liquid crystal layer 90 slips down due to gravity. In other words, when the LCD device is driven under high temperature ambience, the patterned spacer 83 may be separated from the first substrate 40 or/and the second substrate 70, thereby failing to maintain the cell-gap between the first and second substrates 40 and 70. Moreover, since the patterned spacer 83 has lower elasticity than the ball spacer, the patterned spacer 83 can be distorted by even a low impact. Accordingly, when an active region of the LCD device, which is a region displaying images, is touched, flaws such as thickness non-uniformity of the liquid crystal layer occur. To resolve the above-mentioned problems, a double-structure patterned spacer that has two spacers with different heights is suggested.

FIG. 4 is a cross-sectional view showing an LCD device having the double-structure patterned spacer according to the related art. Since the LCD device of FIG. 4 is similar to the LCD device of FIG. 3 except for the double-structure patterned spacer, the description regarding the other parts of the LCD device of FIG. 4 is omitted.

As shown in FIG. 4, the double-structure patterned spacer consists of first and second patterned spacers 183a and 183b that are formed on a common electrode 179 of a second substrate 170. The first patterned spacer 183a has a first height h1 and contacts both a passivation layer 163 of a first substrate 140 and the common electrode 179 of the second substrate 170. The second patterned spacer 183b has a second height h2 shorter than the first height h1, and only contacts the common electrode 179 of the second substrate 170. In other words, the second patterned spacer 183b is separated from the passivation layer 163 of the first substrate 140.

According to the related art, a gap between the passivation layer 163 and the second patterned spacer 183b is more than about 0.4 µm. That is, a height difference between the first and second patterned spacers 183a and 183b is more than about 0.4 µm. Since a distance between the passivation layer 163 and the second patterned spacer 183b is too far, the above-mentioned flaws can not be effectively prevented. It is required that the height difference between the first and second patterned spacers 183a and 183b is less than 0.4 µm. However, since the first and second patterned spacers 183a and 183b are formed of an organic insulating material of several micrometers through at least two mask processes to obtain the height difference, it is practically difficult to shorten the height difference, and also it causes an increase in production costs of the LCD device.

SUMMARY OF THE INVENTION

Accordingly, the present invention is directed to a liquid crystal display (LCD) device and a method of fabricating the same that substantially obviate one or more of the problems due to limitations and disadvantages of the related art.

An object of the present invention is to provide an LCD device that has a double-structure patterned spacer protecting the LCD device from an outer touch without complicating fabrication processes and without increasing production costs.

Another object of the present invention is to provide a method of fabricating a LCD device having a double-structure patterned spacer without additional mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an LCD device includes a gate line and a data line crossing each other to define a pixel region on a first substrate, a thin film transistor connected to the gate line and the data line, a first protrusion and a second protrusion formed on the first substrate, a pixel electrode connected to the thin film transistor in the pixel region, a first patterned spacer and a second patterned spacer formed on a second substrate facing the first substrate, wherein the first patterned spacer corresponds to the first protrusion, and the second patterned spacer corresponds to the second protrusion, and a liquid crystal layer interposed between the first and second substrates.

In another aspect of the present invention, a method of fabricating an LCD device includes forming a gate line and a gate electrode extending from the gate line on a first substrate having a pixel region, forming a gate insulating layer on the gate line and the gate electrode, forming a data line on the gate insulating layer to define a pixel region with the gate line, an active layer on the gate insulating layer, an ohmic contact layer on the active layer, a source electrode on the ohmic contact layer, a drain electrode spaced apart from the source electrode on the ohmic contact layer, a first protrusion on the gate insulating layer and a second protrusion on the gate insulating layer, forming a passivation layer having a drain contact hole on the data line, the source and drain electrode and the first and second protrusions, the drain contact hole exposing the drain electrode, forming a pixel electrode connected to the drain electrode through the drain contact hole on the passivation layer, forming first and second patterned spacers on a second substrate facing the first substrate, attaching the first and second substrate such that the first and second patterned spacers face the first and second protrusions, respectively, and forming a liquid crystal layer between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
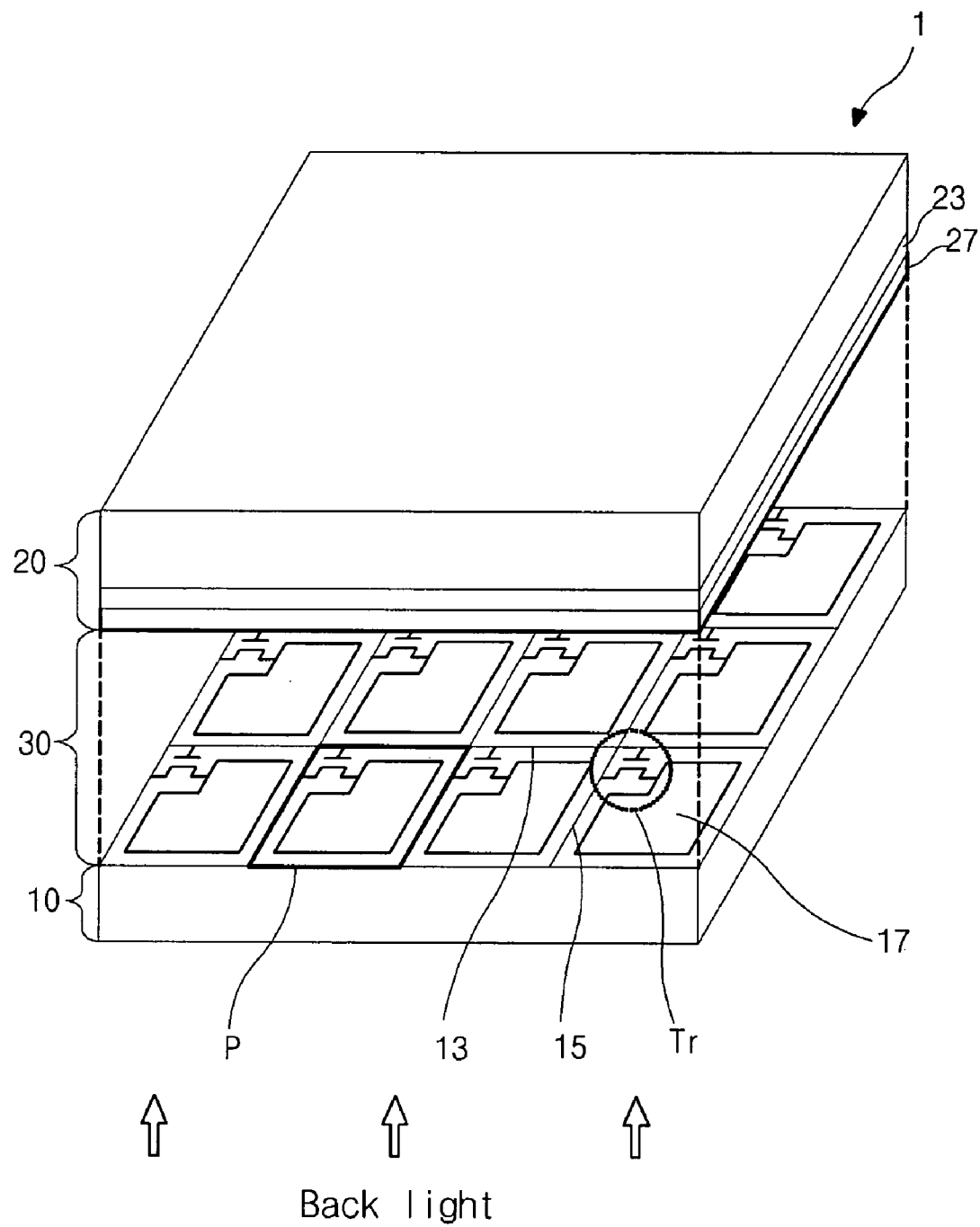
FIG. 1 is a schematic perspective view of an LCD device according to the related art.
Figure 2:
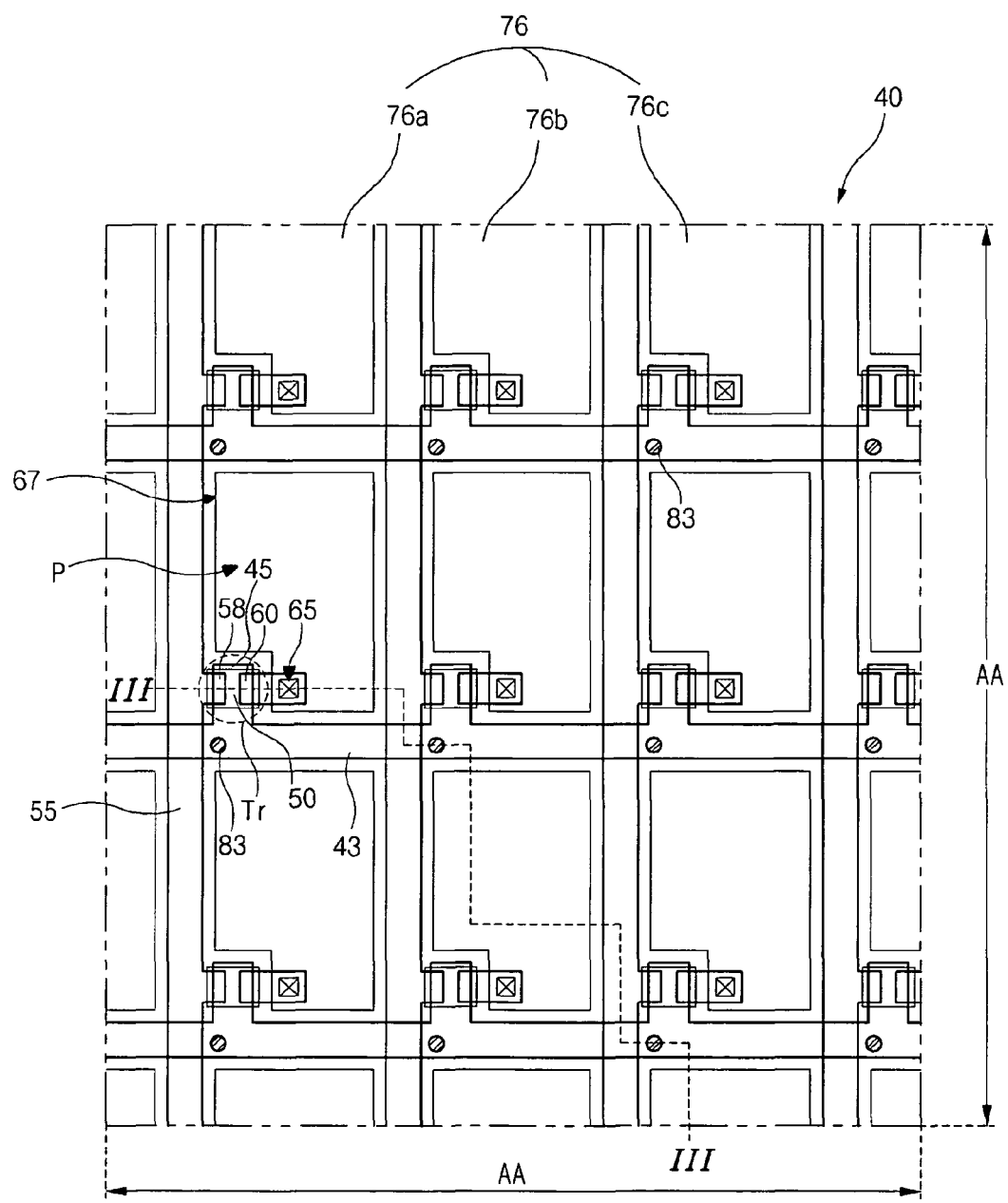
FIG. 2 is a plane view of an LCD device having a patterned spacer according to the related art.
Figure 3:
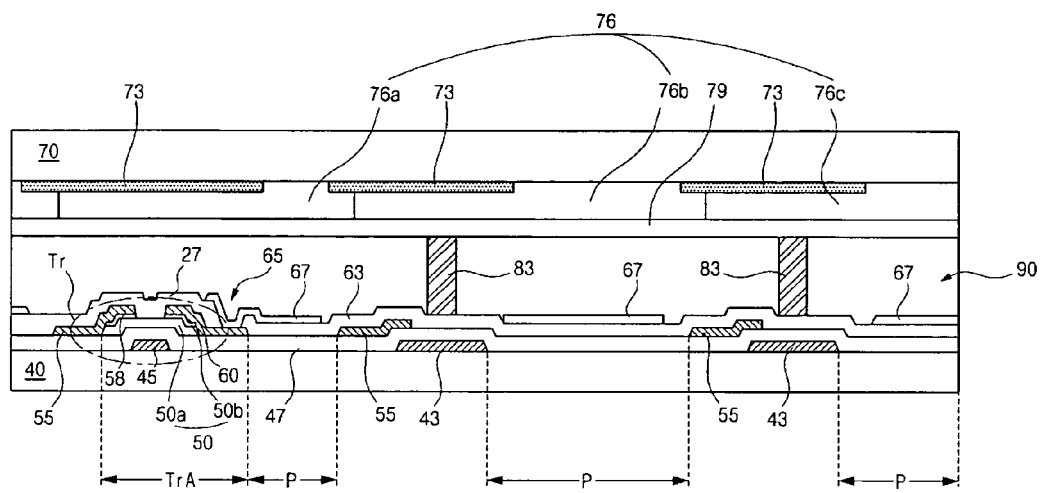
FIG. 3 is a cross-sectional view of an LCD device taken along the line III-III of FIG. 2.
Figure 4:
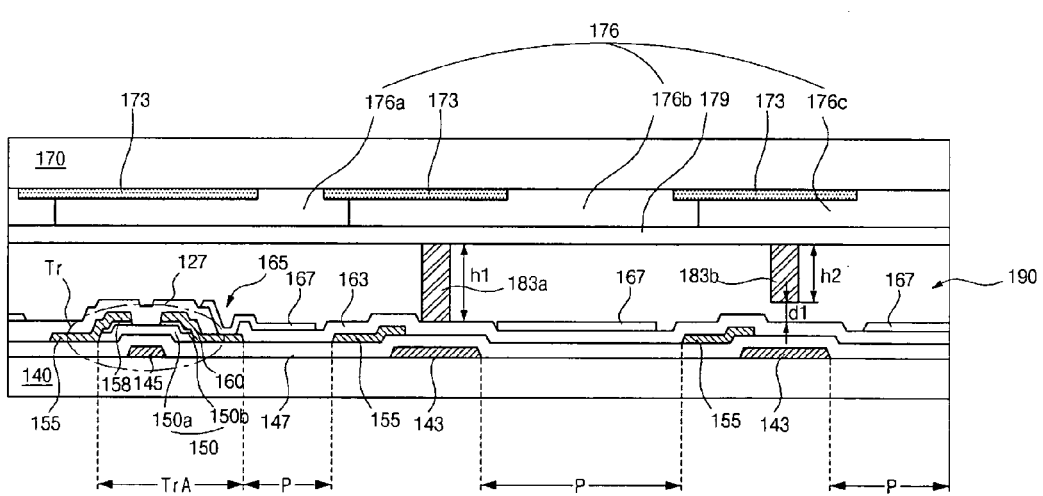
FIG. 4 is a cross-sectional view of an LCD device having a double-structure patterned spacer according to the related art.
Figure 5:
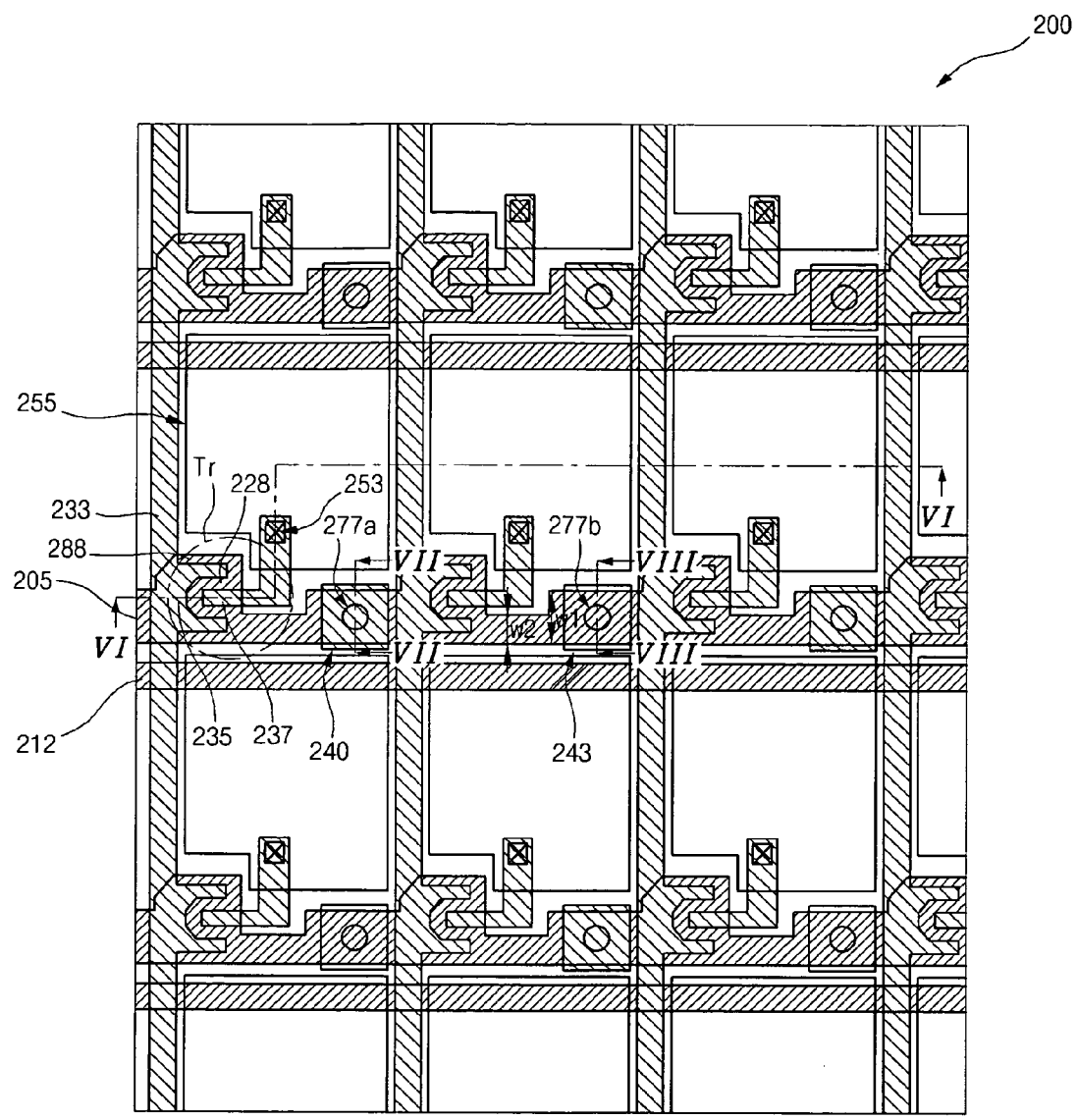
FIG. 5 is a plane view of an LCD device according to an exemplary embodiment of the present invention.
Figure 6:
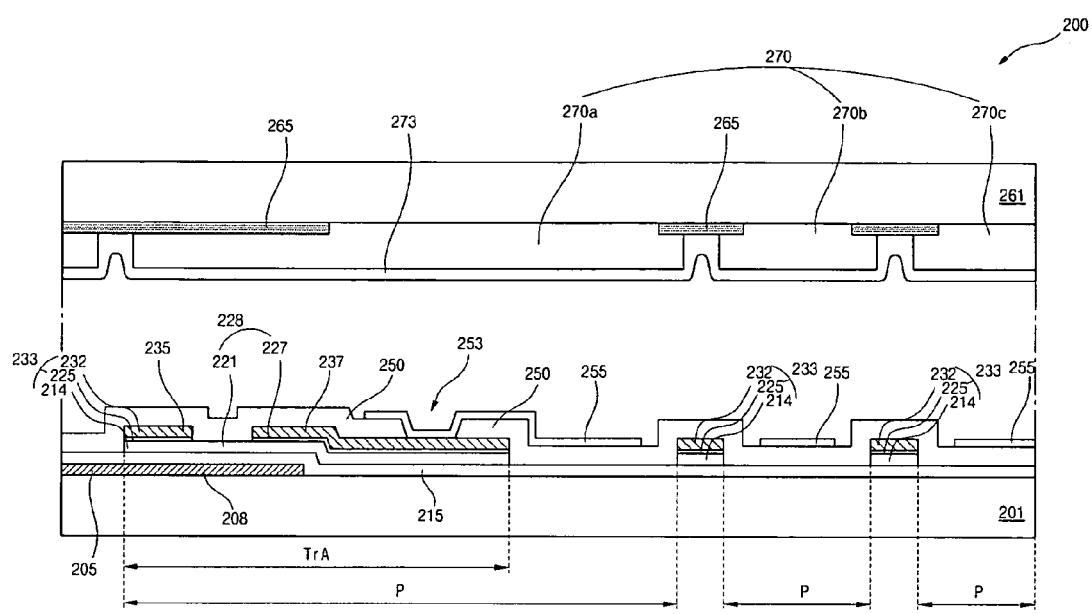
FIG. 6 is a cross-sectional view of an LCD device taken along the line VI-VI of the FIG. 5.

FIG. 5 is a plane view of an LCD device according to an exemplary embodiment of the present invention. FIG. 6 is a cross-sectional view of an LCD device taken along the line VI-VI of the FIG. 5, FIG. 7 is a cross-sectional view of an LCD device taken along the line VII-VII of the FIG. 5, and FIG. 8 is a cross-sectional view of an LCD device taken along the line VIII-VIII of the FIG. 5.

Referring to FIG. 6, an LCD device 200 includes first and second substrates 201 and 261 that face each other. A black matrix 265 and a color filter layer 270 are sequentially formed on the second substrate 261. The black matrix 265 corresponds to gate and data lines 205 and 233 on the first substrate 201 and surrounds a pixel region P on the first substrate 201. The color filter layer 270 corresponds to the pixel region P and includes sub-color filters 270a, 270b and 270c of red, green and blue colors. A common electrode 273 is arranged on the color filter layer 270 and may be formed of a transparent conductive material. A first patterned spacer 277a (of FIG. 7) and a second patterned spacer 277b (of FIG. 8) are formed on the common electrode 273. The first and second patterned spacer 277a and 277b are arranged to correspond to the gate line 205 of the first substrate 201 and to have a predetermined area and substantially the same height. An overcoat layer (not shown) may be formed of an organic insulating material between the common electrode 273 and the color filter layer 270 to protect the sub-color filters 270a, 270b and 270c and to supplement a step difference resulted from the black matrix 265 and the sub-color filters 270a, 270b and 270c. Also, in an in-plane switching mode LCD device, the common electrode 273 may be formed on the first substrate 201 and alternately arranged with a pixel electrode 255. In an exemplary embodiment according to the present invention, a twisted nematic mode LCD device, in which the common electrode 273 and the pixel electrode 255 are disposed on different substrates, is described.

Referring to FIG. 5, the gate line 205 and a common line 212 are formed on the first substrate 201 such that they are parallel to but spaced apart from each other. The data line 233 crosses the gate line 205, thereby defining the pixel region P. A thin film transistor (TFT) Tr, as a switching element, is formed at a crossing portion of the gate and data lines 205 and 233. As shown in FIG. 6, the TFT Tr includes a gate electrode 208, a gate insulating layer 215 on the gate electrode 208, a semiconductor layer 228 including an active layer 221 and an ohmic contact layer 227 on the gate insulating layer 215, and source and drain electrodes 235 and 237 spaced apart from each other. Also, as shown in FIGS. 7 and 8, a first protrusion 240 (of FIG. 7) and a second protrusion 243 (of FIG. 8) are formed corresponding to the gate line 205 on the gate insulating layer 215. At this, as shown in FIG. 5, the gate line 205 has a first width w1 corresponding to a portion that the gate line 205 overlaps the first and second protrusions 240 and 243. Also, the gate line 205 has a second width w2 corresponding to a portion between the TFT Tr and the first protrusion 240 or the second protrusion 243. The first width w1 is greater than the second width w2.

Figure 7:
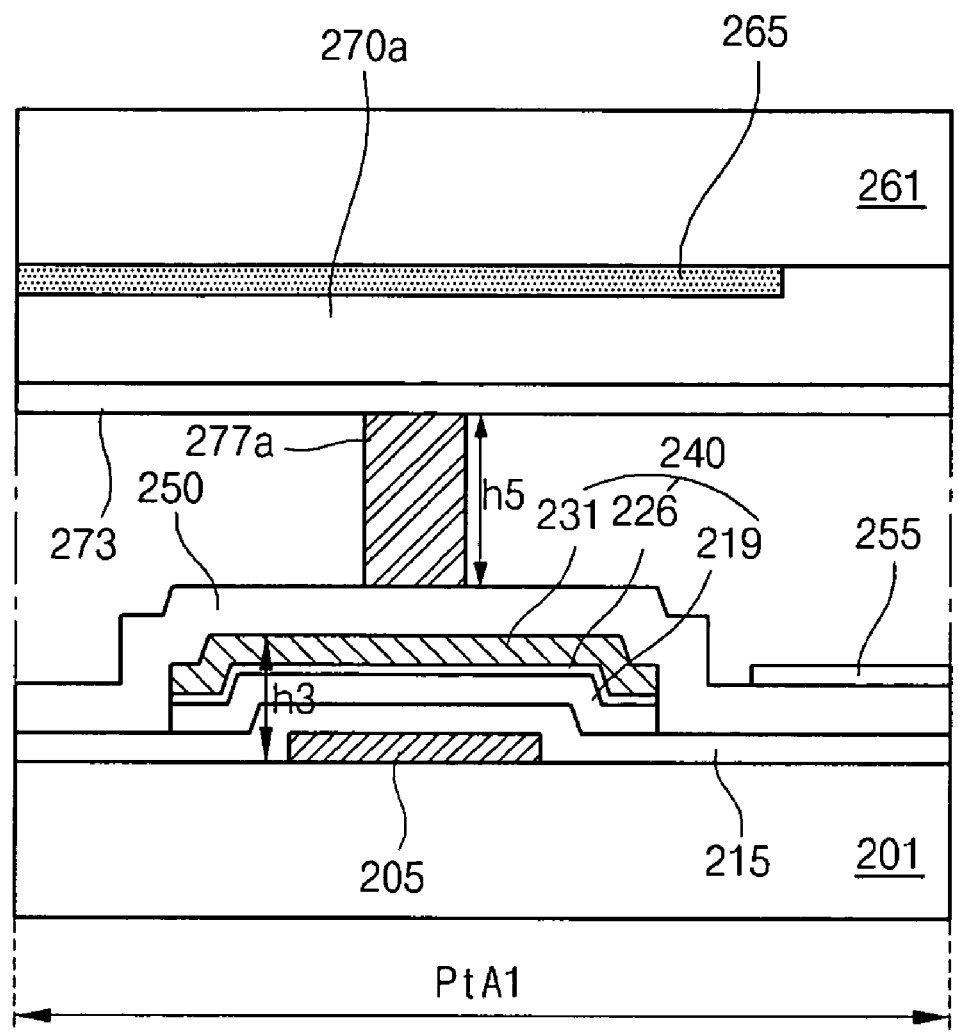
FIG. 7 is a cross-sectional view of an LCD device taken along the line VII-VII of the FIG. 5.
Figure 8:
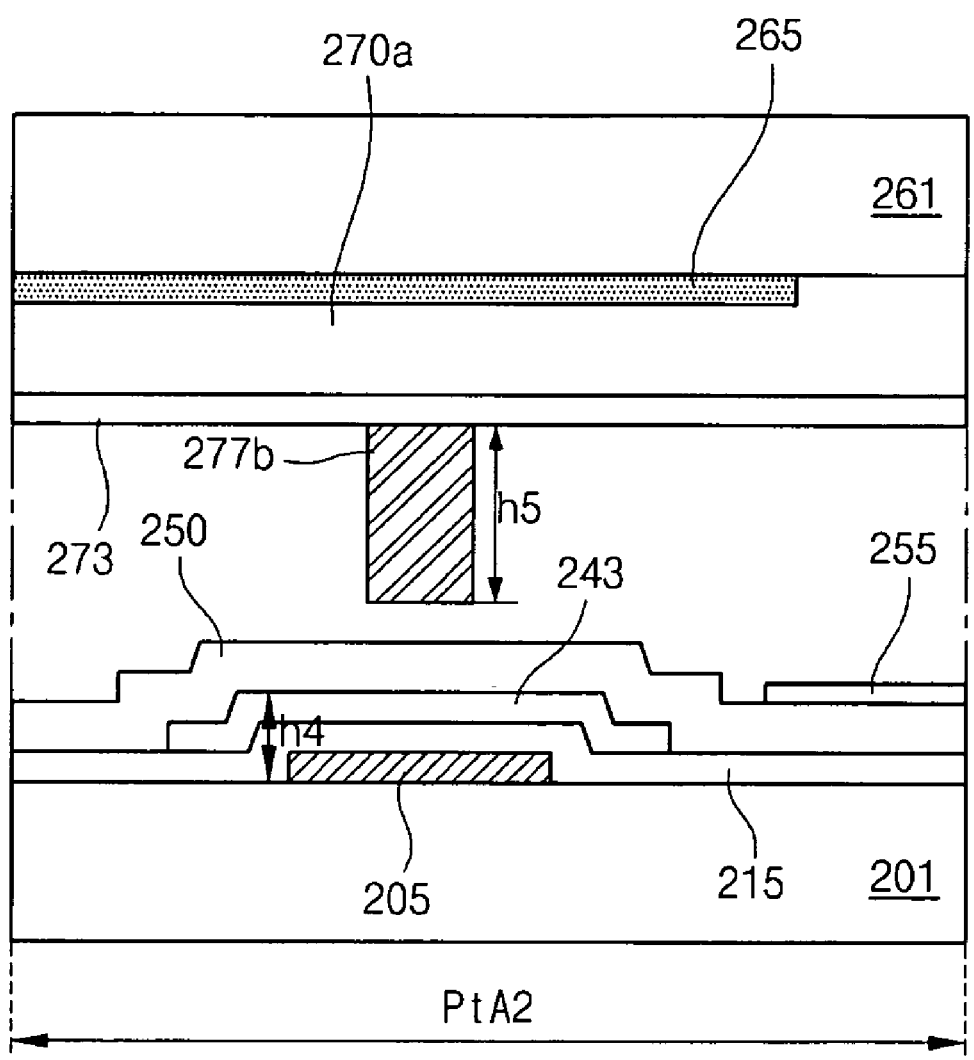
FIG. 8 is a cross-sectional view of an LCD device taken along the line VIII-VIII of the FIG. 5.

Referring to FIG. 7, the first protrusion 240 corresponding to the first patterned spacer 277a is shaped like an island and includes a protrusion active layer 219, a protrusion ohmic contact layer 226 and a protrusion metal layer 231. The protrusion active layer 219 is arranged on the gate insulating layer 215. Also, the protrusion active layer 219 may be formed of the same material as the active layer 221 (of FIG. 6) of the semiconductor layer 228 in a same process. The protrusion ohmic contact layer 226 is arranged on the protrusion active layer 219. Also, the protrusion ohmic contact layer 226 may be formed of the same material as the ohmic contact layer 227 (of FIG. 6) of the semiconductor layer 228 in a same process. The protrusion metal layer 231 is arranged on the protrusion ohmic contact layer 226, and may be formed of the same material as the source and drain electrodes 235 and 237 (of FIG. 6) in a same process. Moreover, the first protrusion 240 has a third height h3 that is substantially the same as a total height of the gate electrode 205, the gate insulating layer 215, the active layer 221, the ohmic contact layer 227 and the protrusion metal layer 231.

Referring to FIG. 8, the second protrusion 243 corresponding to the second patterned spacer 277b is also shaped like an island and is arranged on the gate insulating layer 215. The second protrusion 243 may be formed of the same material as the active layer 221 in a same process as the active layer 221. In this exemplary embodiment, the second protrusion 243 has a fourth height h4 that is substantially the same as a total height of the gate electrode 205, the gate insulating layer 215 and the active layer 221 (of FIG. 6). Thus, there is a height difference (h3-h4) between the first and second protrusions 240 and 243, which is a sum of the height of the ohmic contact layer 226 and the height of the protrusion metal layer 231 (of FIG. 7). The protrusion metal layer 231 and the data line 233 have a same height between about 0.1 μm and about 0.2 μm. The protrusion ohmic contact layer 226 and the ohmic contact layer 227 have a same height between about 0.05 μm and about 0.1 μm. Therefore, the height difference (h3-h4) between the first and second protrusions 240 and 243 is between about 0.15 μm and about 0.3 μm.

Thus, as shown in FIGS. 6 to 8, the LCD device according to the exemplary embodiment includes the first and second substrate 201 and 261. The second substrate 261, which is transparent, includes the black matrix 265, the color filter layer 270, the common electrode 273 and the first and second patterned spacer 277a and 277b. The black matrix 265, which has a lattice shape with a plurality of openings, is arranged on the second substrate 261. The color filter layer 270 including the three sub-color filters 270a, 270b and 270c of red, green and blue colors is arranged on the black matrix 265 such that the color filter layer 270 partially overlaps the black matrix 265 and covers the plurality of openings. The common electrode 273 is arranged on the color filter layer 270, and may be formed of a transparent conductive material such as indium-tin-oxide (ITO) and indium-zinc-oxide (IZO). The first and second patterned spacers 277a and 277b have the same height h5 and are arranged on the common electrode 273 so that the first and second patterned spacers 277a and 277b correspond to the gate line 205 of the first substrate 201.

The first substrate 201, which is also transparent, includes a switching region TrA and the pixel region P (of FIG. 6). The gate line 205, the gate electrode 208 and the common line (not shown) are formed on the first substrate 201. The gate electrode 208 is extended into the pixel region P from the gate line 205, and the common line (not shown) is parallel to the gate line 205. Moreover, the gate electrode 208 and the common line are arranged on the first substrate 201 at a same layer as the gate line 205. The gate insulating layer 215, which may be formed of an inorganic insulating material, is arranged to cover the gate line 205, the gate electrode 208 and the common line. In the switching region TrA of FIG. 6, the semiconductor layer 228, which includes the active layer 221 of pure amorphous silicon and the ohmic contact layer 227 of impure amorphous silicon on both ends of the active layer 221, is arranged on the gate insulating layer 215. The source and drain electrodes 235 and 237 are arranged on the ohmic contact layer 227 and are spaced apart from each other. As shown in FIG. 6, since the ohmic contact layer 227 is formed at the both ends of the active layer 221 and the source and drain electrodes 235 and 237 are spaced apart from each other, the active layer 221 is exposed through a portion between the source and drain electrodes 235 and 237.

The data line 233 includes a first data layer 214, a second data layer 225 and a third data layer 232. The data line 233 crosses the gate line 205 to define the pixel region P and also is connected to the source electrode 235 as shown in FIG. 5. Since the LCD device according to the exemplary embodiment is manufactured by 4 mask processes, the first data layer 214 is arranged on the gate insulating layer 215 and may be formed of the same material as the active layer 221 in a same process, the second data layer 225 is arranged on the first data layer 214 and may be formed of the same material as the ohmic contact layer 227 in a same process, and the third data layer 232 is arranged on the ohmic contact layer 227 (the second data layer 225) and may be formed of the same material as the source and drain electrodes 235 and 237 in a same process as the source and drain electrodes 235 and 237. Thus, the data line 233 has a triple-layered structure.

As described above, in the exemplary embodiment, the first protrusion 240 corresponding to the first patterned spacer 277a and the second protrusion 243 corresponding to the second patterned spacer 277b are each arranged with an island shape on the gate insulating layer 215. The first protrusion 240 has a triple-layered structure in which the protrusion active layer 219, the protrusion ohmic contact layer 226 and the protrusion metal layer 231 are sequentially disposed and each has a substantially greater cross-sectional area than the first patterned spacer 277a. Also, the second protrusion 243 is a single-layered structure and has a substantially greater cross-sectional area than the second patterned spacer 277b. Regarding the cross-sectional areas of the first and second patterned spacers 277a and 277b and an aperture ratio of the LCD device, a width of the first and second protrusion 240 and 243 may be less than about 26 micrometers. Then, the passivation layer 250, which has the drain contact hole 253 exposing the drain electrode 237, is disposed on the source and drain electrodes 235 and 237, first and second protrusions 240 and 243 and the data line 233. As shown in FIG. 6, the pixel electrode 255 is disposed on the passivation layer 250 in the pixel region P and contacts the drain electrode 237 through the drain contact hole 253. The pixel electrode 255 includes one of ITO and IZO layers. The thus-structured LCD device according to the exemplary embodiment is able to prevent the problems of the related art.

FIGS. 9A to 9G are cross-sectional views schematically illustrating a process of fabricating a portion of an array substrate taken along the line VI-VI of FIG. 5, FIGS. 10A to 10G are cross-sectional views schematically illustrating a process of fabricating a portion of an array substrate taken along the line VII-VII of FIG. 5, and FIGS. 11A to 11G are cross-sectional views schematically illustrating a process of fabricating a portion of an array substrate taken along the line VIII-VIII of FIG. 5. The pixel region P includes a switching region TrA in which the TFT Tr is located. Moreover, as shown in FIGS. 7 and 8, regions, in which the first and second protrusions 240 and 243 are located, are defined as first and second protrusion regions PtA1 and PtA2, respectively.

Figure 9A:
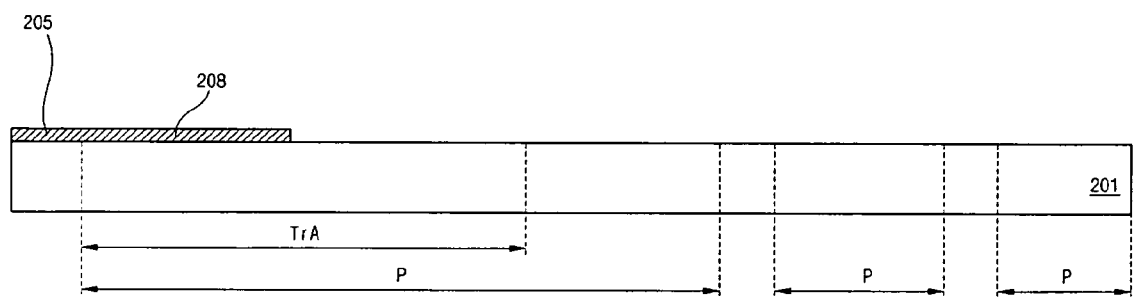
FIGS. 9A to 9G are cross-sectional views showing a process of fabricating a portion of an array substrate taken along the line VI-VI of FIG. 5, according to an exemplary embodiment of the present invention.
Figure 10A:
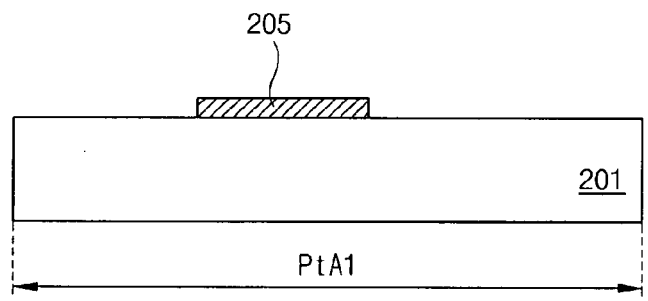
FIGS. 10A to 10G are cross-sectional views showing a process of fabricating a portion of an array substrate taken along the line VII-VII of FIG. 5, according to an exemplary embodiment of the present invention.
Figure 11A:
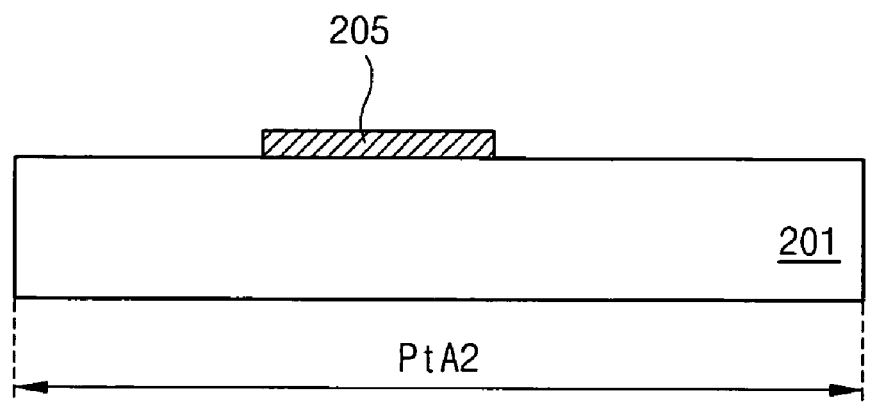
FIGS. 11A to 11G are cross-sectional views showing a process of fabricating a portion of an array substrate taken along the line VIII-VIII of FIG. 5, according to an exemplary embodiment of the present invention.

As shown in FIGS. 9A, 10A and 11A, the gate line 205, the gate electrode 208 and the common line (not shown) are formed of a first metal material on the first substrate 201 by a first mask process. The first mask process includes forming a first metal layer (not shown) by depositing the first metal material, coating a first photoresist layer (PR layer), exposing and developing the first PR layer to form a photoresist pattern (PR pattern) (not shown) using a first patterning mask, etching the first metal layer and stripping the PR pattern. Thus, the gate line 205, the gate electrode 208 and the common line are formed by the first mask process. The gate line 205 is arranged along a direction of the first substrate 201, the gate electrode 208 is extended from the gate line 205 to the switching region TrA of the pixel region P, and the common electrode is arranged in parallel to and apart from the gate line 205. Moreover, as shown in FIG. 5, the gate line 205 has the first width w1 corresponding to the first and second protrusion regions PtA1 and PtA2 and the second width w2 corresponding to other regions. The first width w1 is greater than the second width w2. However, the first width w1 is equal to or less than the width of the first and second protrusions 240 and 243. If the first and second protrusions 240 and 243 each have a circular shape, the first width w1 is equal to or less than a diameter of each of the first and second protrusions 240 and 243.

Figure 9B:
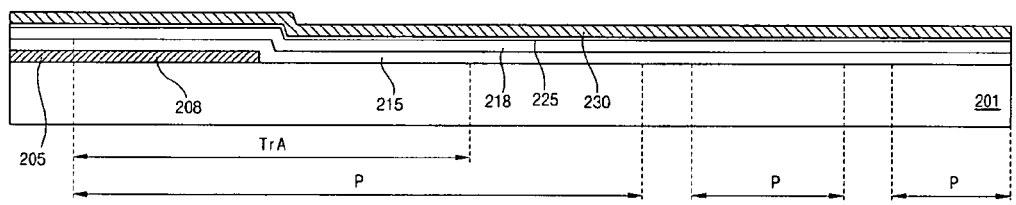
Figure 10B:
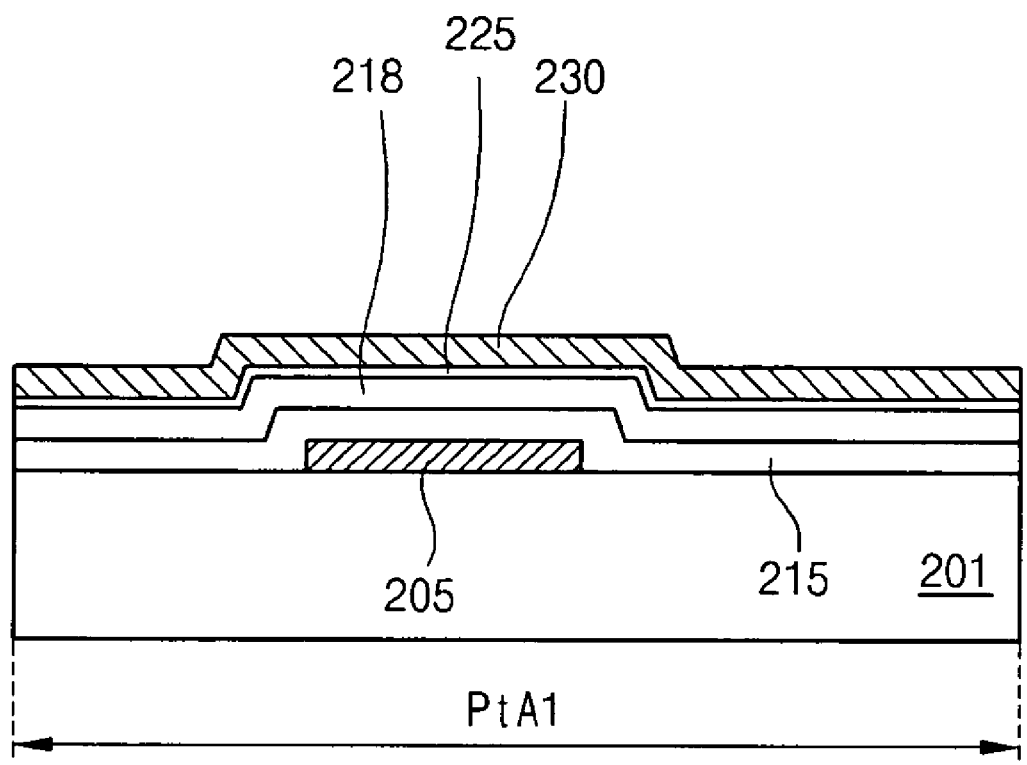
Figure 11B:
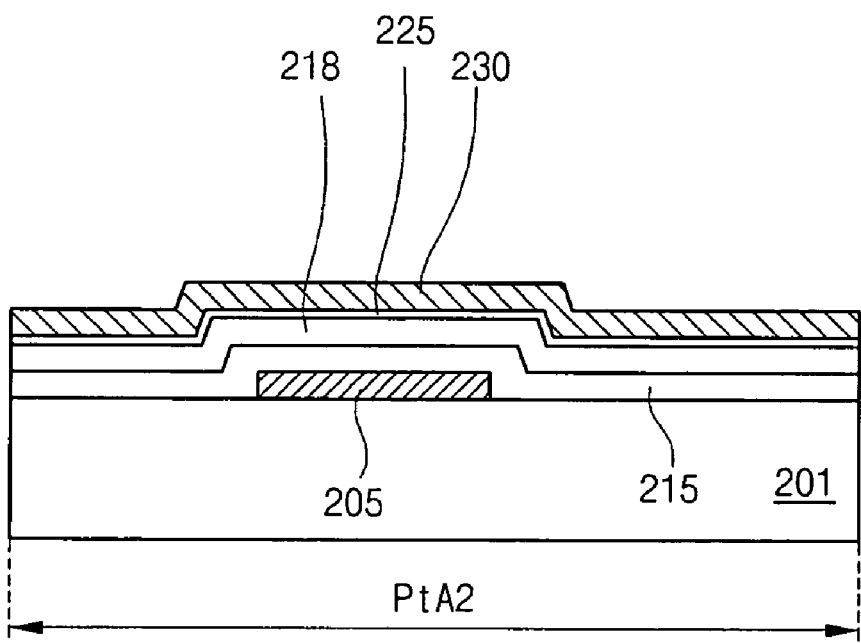

As shown in FIGS. 9B, 10B and 11B, the gate insulating layer 215 is formed on the gate line 205, the gate electrode 208 and the common line (not shown) by depositing the inorganic insulating material such as silicon oxide and silicon nitride. After that, pure amorphous silicon layer 218 of the pure amorphous silicon, impure amorphous silicon layer 225 of the impure amorphous silicon and a second metal layer 230 of a second metal material are sequentially formed on the gate insulating layer 215. The pure amorphous silicon layer 218 may have a height between about 0.05 μm and about 0.15 μm, the impure amorphous silicon layer 225 may have a height between about 0.05 μm and about 0.1 μm, and the second metal layer 230 may have a height between about 0.1 μm and about 0.2 μm.

Figure 9C:
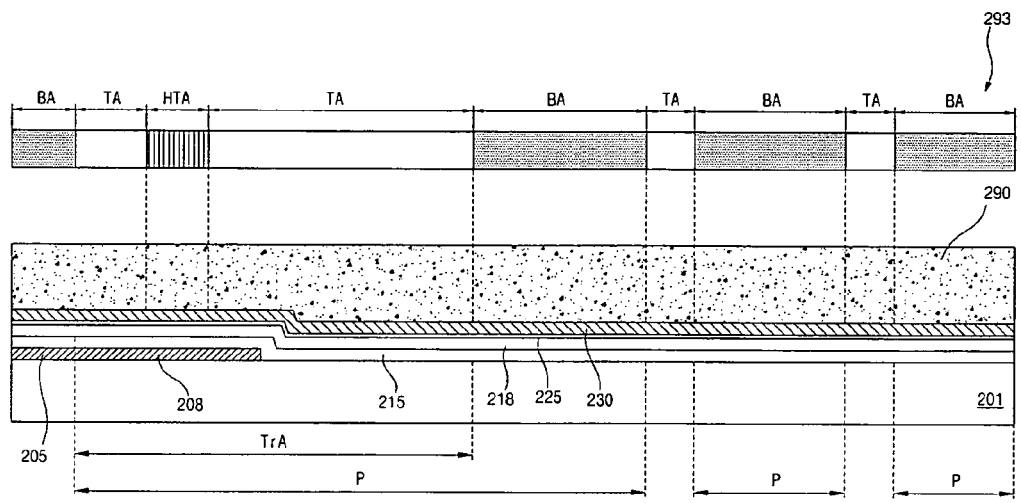

Next, a second mask process is described with reference to FIGS. 9C to 9E, FIGS. 10C to 10E and FIGS. 11C to 11E. As shown in FIGS. 9C, 10C and 11C, a second PR layer 290 is formed on the first metal layer 230, and is then exposed to ultra-violet (UV) light using a second patterning mask 293. The second patterning mask 293 includes a transmissive area TA having a first transmittance, a blocking area BA having a second transmittance and a half-transmissive area HTA having a third transmittance. The third transmittance is greater than the second transmittance but is less than the first transmittance. When the second PR layer 290 is a negative type, the transmissive area TA is disposed over first and second portions and the first protrusion region PtA1, the half-transmissive area HTA is disposed over a third portion and the second protrusion region PtA2, and the blacking area BA is disposed over a fourth portion. The half-transmissive area HTA has greater transmittance than the blocking area BA, and less transmittance than the transmissive area TA. Herein, the first portion corresponds to the data line 233 (of FIG. 6), and the second portion corresponds to the source and drain electrodes 235 and 237 (of FIG. 6). The third portion, referred to as a channel region CH, corresponds a portion to be exposed through a hole between the source and drain electrodes 235 and 237, and the fourth portion is a portion except for the first, second and third portions and the first and second protrusion regions PtA1 and PtA2. When the second PR layer 290 is a positive type, the transmissive area TA and the blocking area BA are substituted by each other. The negative type means that a PR layer irradiated by the UV light remains. Then, the second PR layer 290 is developed.

Figure 9D:
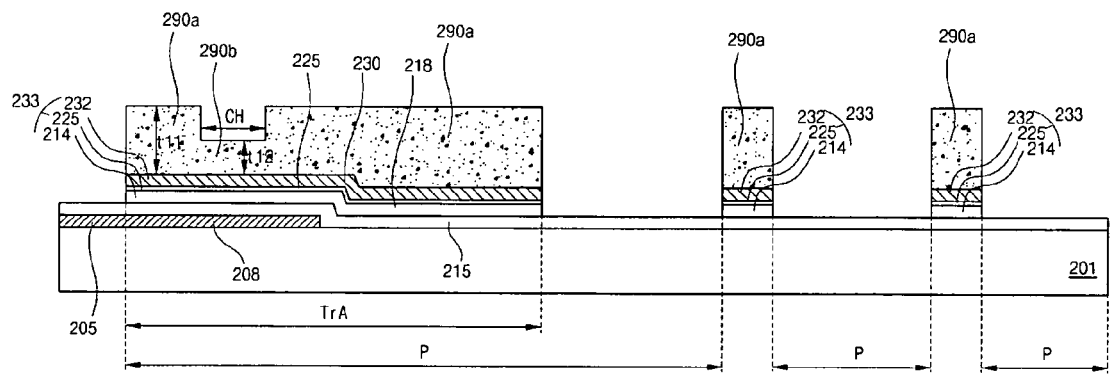
Figure 10C:
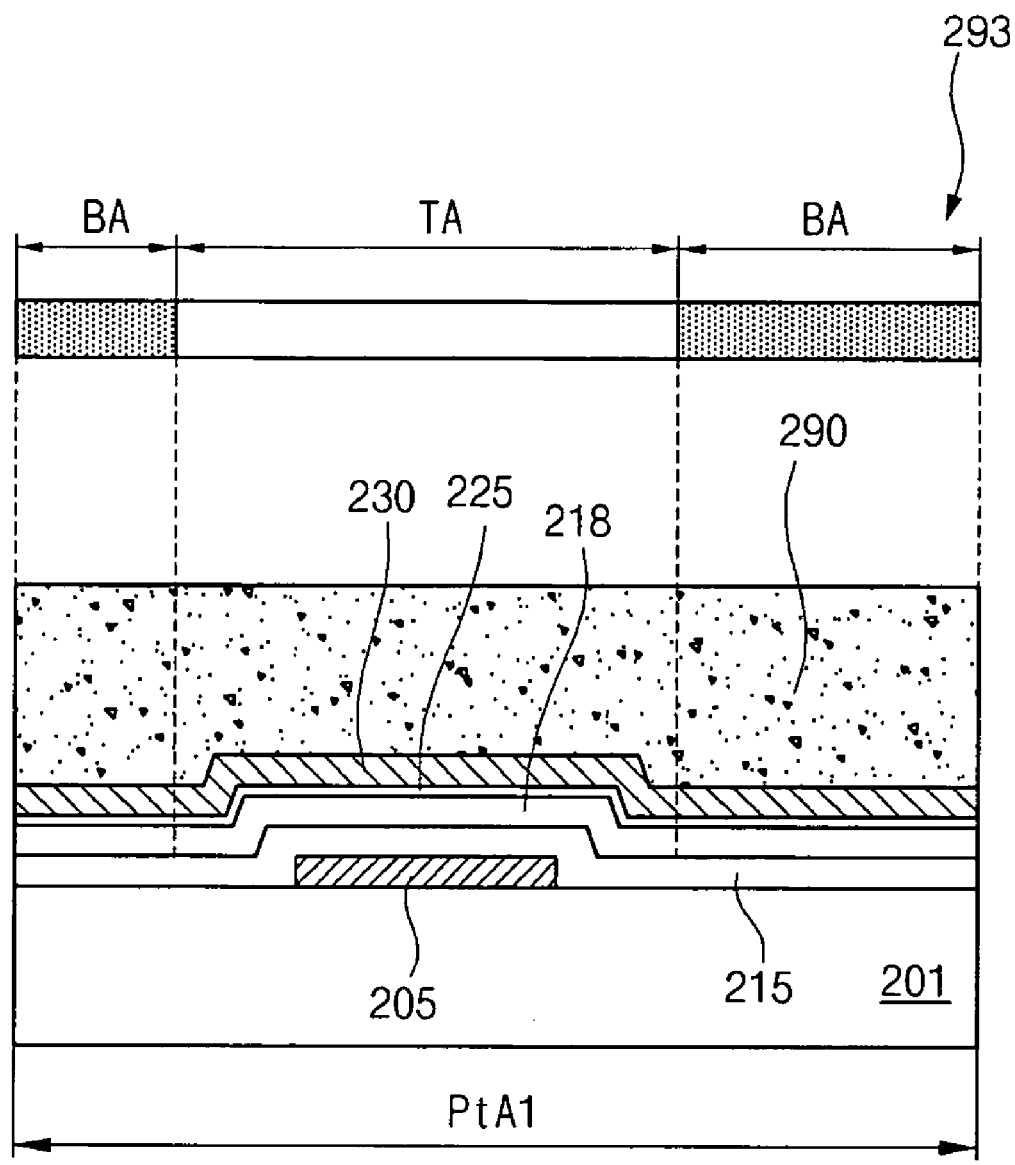
Figure 10D:
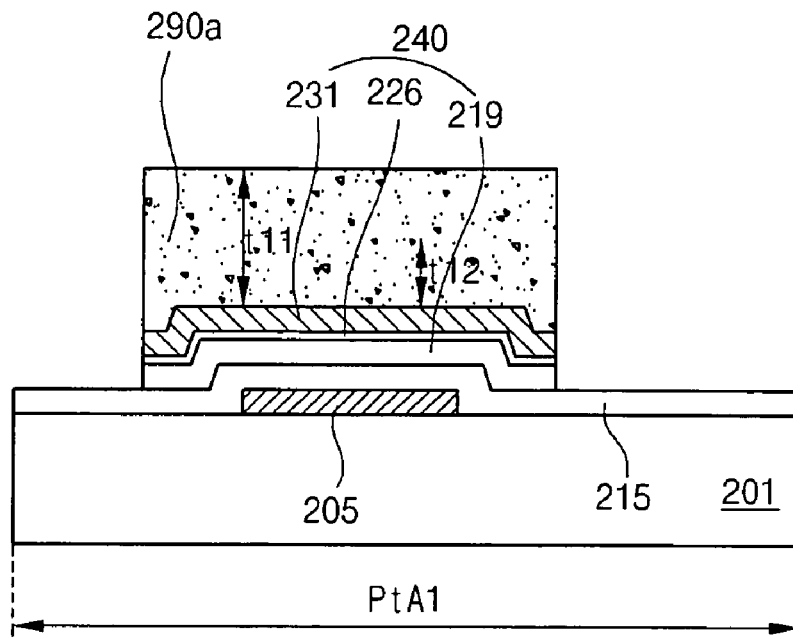
Figure 11C:
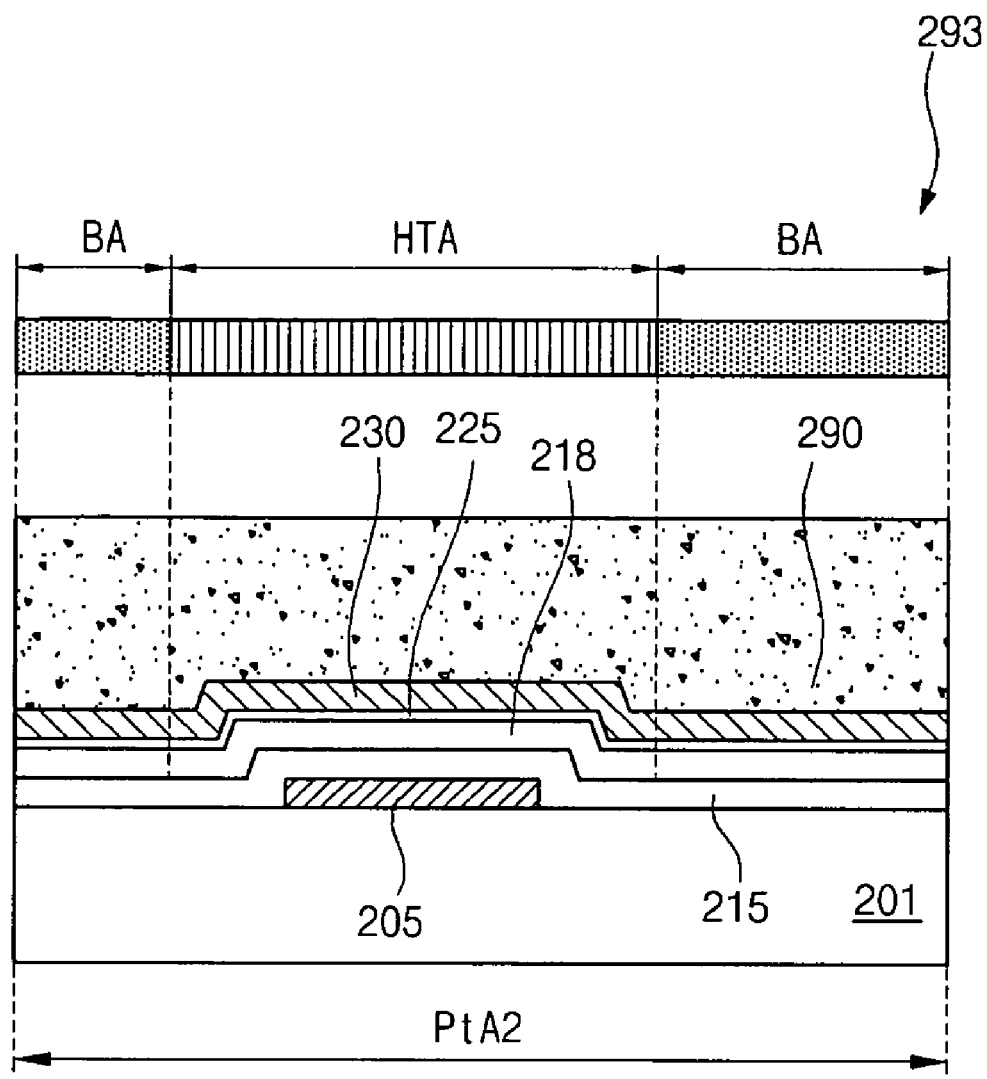
Figure 11D:
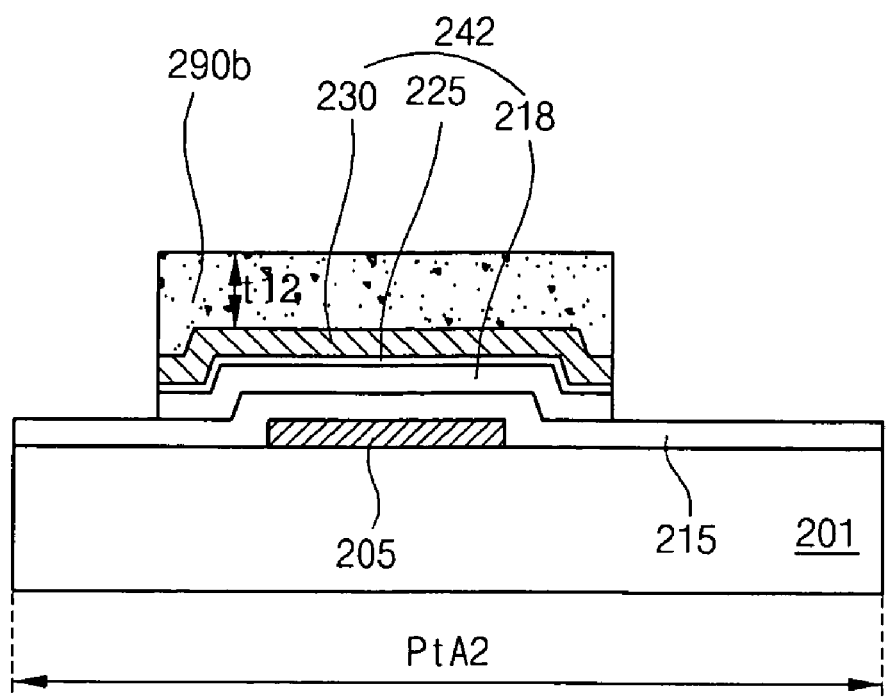

As shown in FIGS. 9D, 10D and 11D, a first PR pattern 290a corresponding to the transmissive area TA (of FIGS. 9C, 10C and 11C) and a second PR pattern 290b corresponding to the half-transmissive area HTA (of FIGS. 9C, 10C and 11C) remain on the second metal layer 230. The first PR pattern 290a has a first thickness t11, and the second PR pattern 290b has a second thickness t12 less than the first thickness. Since the second PR layer 290 (of FIGS. 9C, 10C and 11C) corresponding to the blocking area BA (of FIGS. 9C, 10C and 11C) is completely removed, the second metal layer 230 between the first and second PR patterns 290a and 290b is exposed. Then, the data line 233, the first protrusion 240 and a second protrusion 242 are formed on the gate insulating layer 215 by etching the second metal layer 230 (of FIGS. 9C, 10C and 11C), the impure amorphous silicon layer 225 (of FIGS. 9C, 10C and 11C) and the pure amorphous silicon layer 218 (of FIGS. 9C, 10C and 11C) between the first and second PR patterns 290a and 290b. The data line 233, which includes the first data layer 214, the second data layer 225 and the third data layer 232, crosses the gate line 205 to define the pixel region P. The first protrusion 240 includes the protrusion active layer 219, the protrusion ohmic contact layer 226 and the protrusion metal layer 231. The second protrusion 242 includes the pure amorphous silicon layer 218, the impure amorphous silicon layer 225 and the second metal layer 230.

Figure 9E:
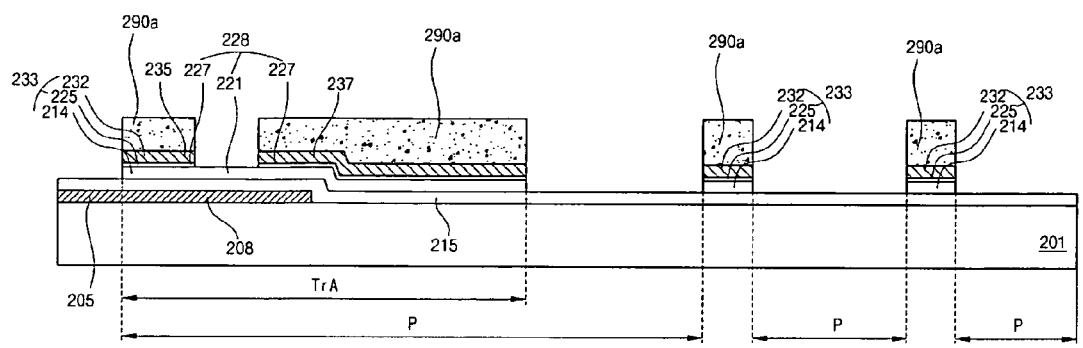
Figure 10E:
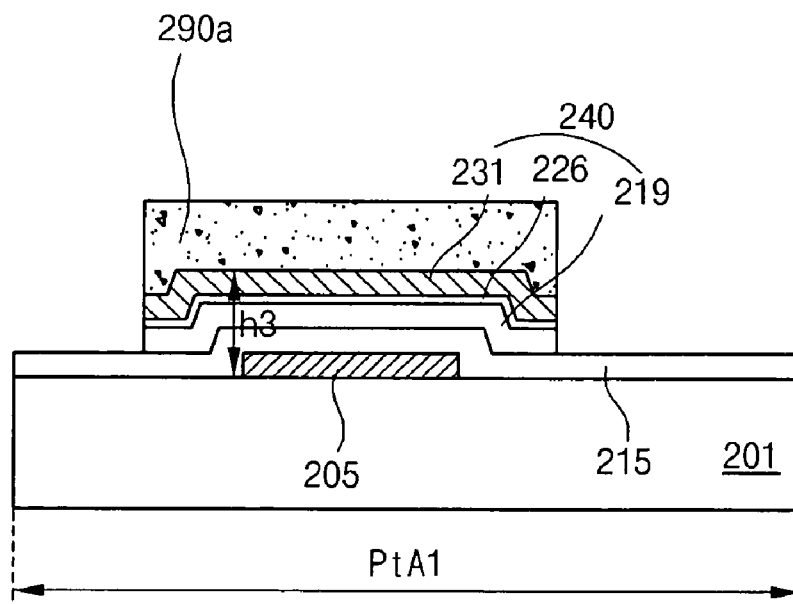
Figure 11E:
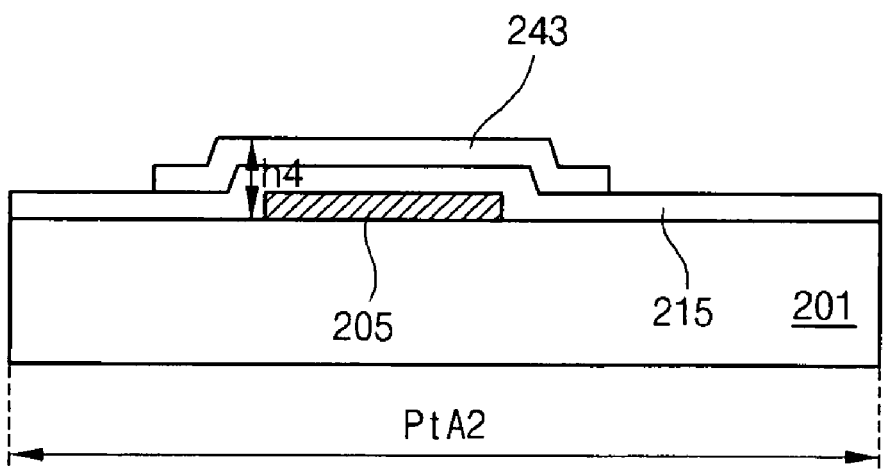

As shown in FIGS. 9E, 10E and 11E, the second PR pattern 290b (of FIGS. 9D, 10D and 11D) having the second thickness t12 in the switching region TrA is removed from the second metal layer 230 by etching, thereby exposing the second metal layer 230 between the first PR patterns 290a in the switching region TrA. At this time, the first PR pattern 290a having the first thickness t11 is also partially removed, thereby decreasing the first thickness t11. After that, the source and drain electrodes 235 and 237 are formed by etching the second metal layer 230 exposed between the first patterns 290a and also etching the impure amorphous silicon layer 225 below the exposed second metal layer 230 using the first PR pattern 290a as a mask. The pure amorphous silicon layer 218 is thus exposed through the channel region CH between the source and drain electrodes 235 and 237. As shown in FIG. 9E, the pure amorphous silicon layer 218 exposed through the channel region CH is defined as the active region 221, the impure amorphous silicon layer 225 at both ends of the active region 221 is defined as the ohmic contact region 227, and the active region 221 and the ohmic contact region 227 are defined as the semiconductor layer 228. At the same time, as shown in FIGS. 11D and 11E, the second PR pattern 290b, the second metal layer 230 and the ohmic contact layer 225 in the second protrusion region PtA2 are removed by etching, and thereby forming the second protrusion 243 with the single-layered structure. And then, the first PR pattern 209a is removed.

As described above, the first protrusion 240 including the protrusion active layer 219, the protrusion ohmic contact layer 226 and the protrusion metal layer 231 is thus formed in the first protrusion region PtA1. The second protrusion 243 is thus formed with the single-layered structure in the second protrusion region PtA2. A height difference between the first and second protrusions 240 and 243 from the first substrate 201 corresponds to a total thickness of the protrusion metal layer 231 and the protrusion ohmic contact layer 226. In this exemplary embodiment, the height difference may be between about 0.15 μm and about 0.3 μm.

Figure 9F:
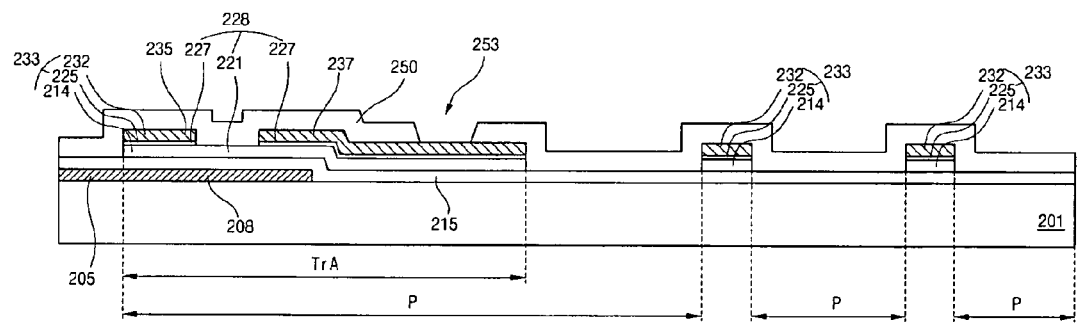
Figure 10F:
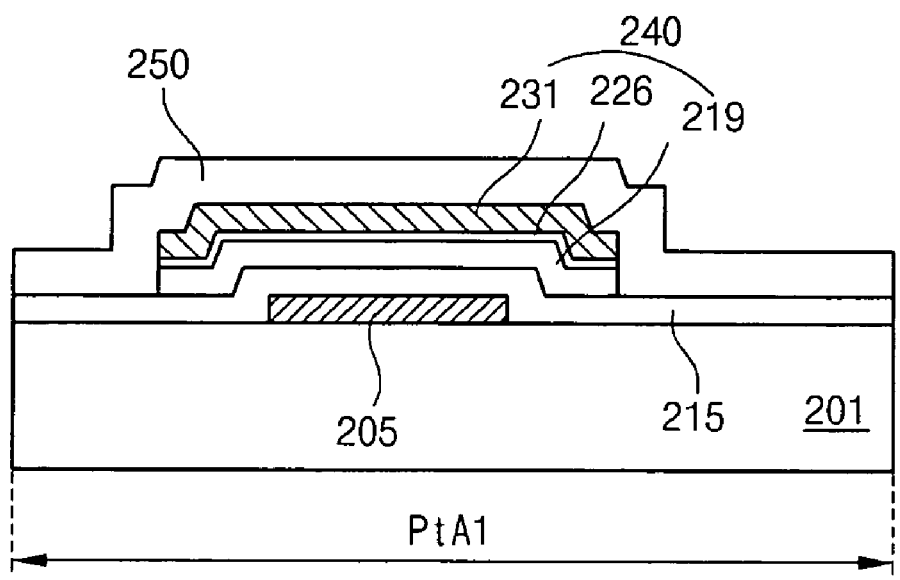
Figure 11F:
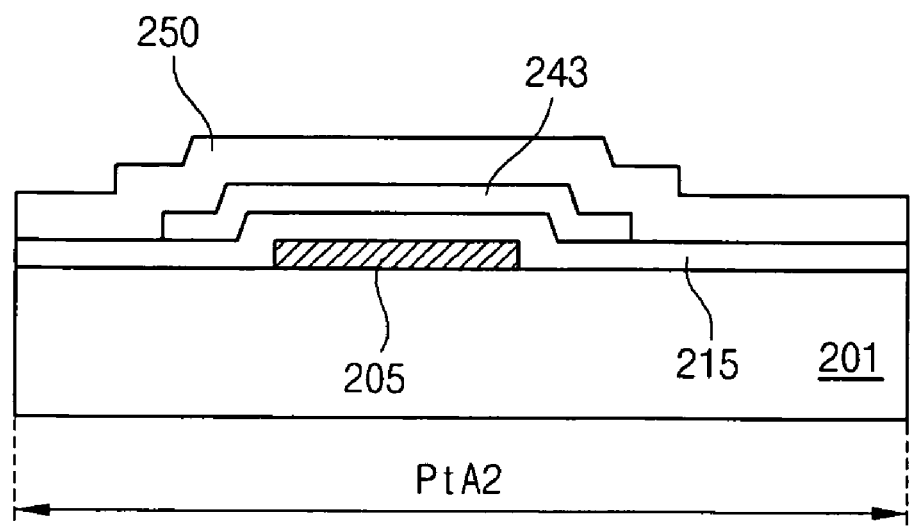

A third mask process is described below with reference to FIGS. 9F, 10F and 11F. As shown in these drawings, the passivation layer 250 having the drain contact hole 253 is formed on the data line 233, the source and drain electrodes 235 and 237 and the first and second protrusions 240 and 243 by depositing the inorganic insulating material, such as silicon oxide and silicon nitride, and then using a third mask to pattern the inorganic insulating material. As shown in FIG. 9F, the drain contact hole 253 exposes a part of the drain electrode 237.

Figure 9G:
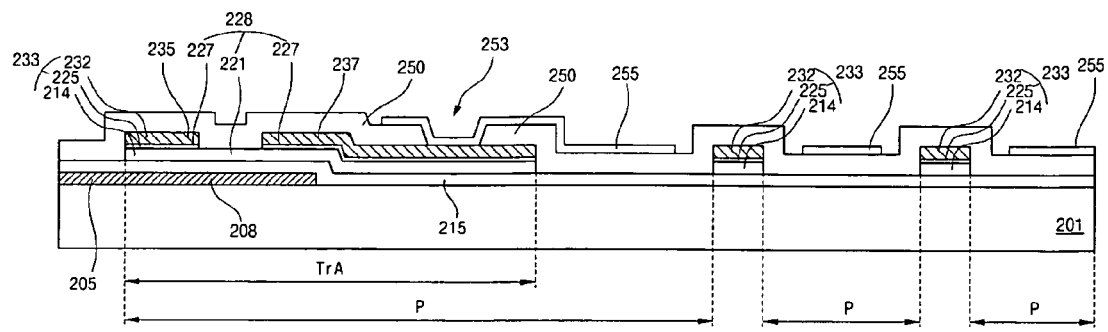
Figure 10G:
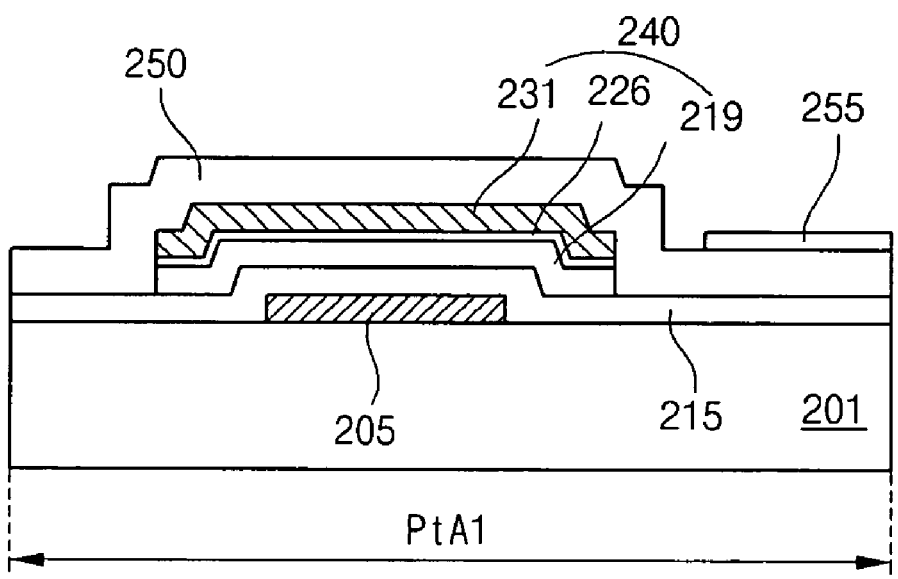
Figure 11G:
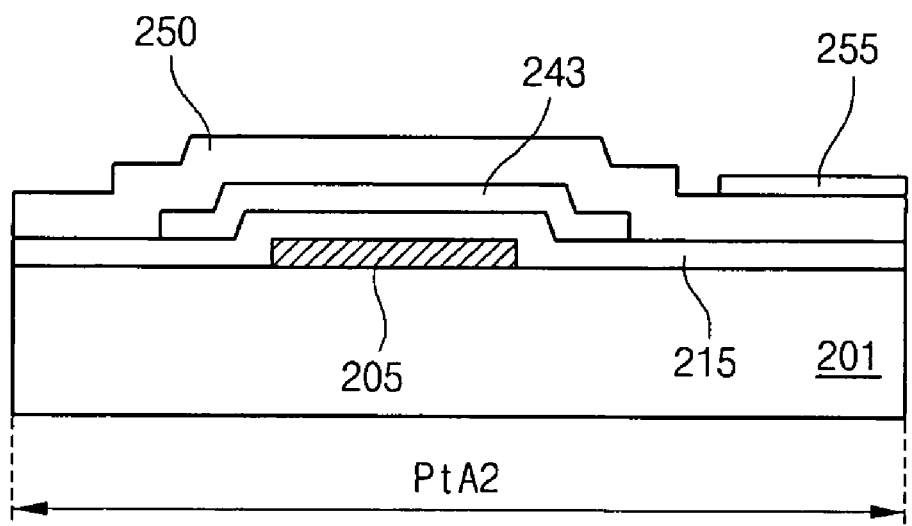

Next, a fourth mask process is performed to form the pixel electrode 255. As shown in FIGS. 9G, 10G and 11G, the pixel electrode 255 is formed on the passivation layer 250 in the pixel region P by depositing the transparent conductive material, such as ITO and IZO, and then using the fourth mask to pattern the transparent conductive material. As shown in FIG. 9G, the pixel electrode 255 is connected to the drain electrode 237 through the drain contact hole 253. The process of fabricating the array substrate using the four masks according to the exemplary embodiment of the present invention is thus completed.

The color filter substrate for the LCD device according to the exemplary embodiment of the present invention may be fabricated by a following method. The black matrix 265, which has the lattice shape with the plurality of openings, is formed on the second substrate 261 by depositing a metal including chrome or coating resin including carbon, and then patterning the metal or resin by a mask process. The color filter layer 270 including three sub-color filters 270a, 270b and 270c of red, green and blue colors is formed in the plurality of openings by coating a resist of red, green and blue colors using a spin-coating method or a bar-coating method, and then patterning the resist by a mask process. Each of the three sub-color filters 270a-270c is spaced apart from each other and corresponds the pixel region P of the first substrate 201. And then, the common electrode 273 of the transparent conductive material such as ITO and IZO is formed on the color filter layer 270 such that the common electrode 273 corresponds to the pixel electrode 255 on the first substrate 201. To protect the color filter layer 270 and supplement a step difference between the three sub-color filters 270a-270c, an overcoat layer may be formed between the color filter layer 270 and the common electrode 273. In another exemplary embodiment, the common electrode 273 may be formed on the first substrate 201. Thus, the first and second patterned spacer 277a and 277b, which have substantially the same height and correspond to the first and second protrusions 240 and 243 on the first substrate 201, respectively, may be formed on the common electrode 273 by forming a thick organic material layer, and then using a mask process to pattern the thick organic material layer. The thick organic material may include a colorless, transparent and photo-sensitive organic material such as photo acrylate and benzocycolbutene.

As described above, according to the exemplary embodiments of the present invention, the first and second patterned spacers 277a and 277b are formed with the same height using the four mask processes. Meanwhile, the array substrate, including the first and second protrusions 240 and 243, are structured to generate a virtual height difference between the first and second patterned spacers 277a and 277b. The LCD device according to the exemplary embodiments of the present invention can be manufactured by attaching the thus-formed first and second substrates 201 and 261 by using a sealant and then interposing the liquid crystal layer between the first and second substrates 201 and 261.

It will be apparent to those skilled in the art that various modifications and variations can be made in the LCD device and the method of fabricating the same of the present invention. Thus, it is intended that the present invention covers the modifications and variations of this invention provided they come within the scope of the appended claims and their equivalents.

What is claimed is:

1. A liquid crystal display (LCD) device, comprising:
    a first substrate and a second substrate facing each other and having a liquid crystal layer interposed therebetween;
    a gate line and a data line crossing each other to define a pixel region on the first substrate;
    a thin film transistor connected to the gate and data lines;
    a first protrusion and a second protrusion formed on the first substrate;
    a pixel electrode connected to the thin film transistor in the pixel region; and
    a first patterned spacer and a second patterned spacer formed on the second substrate, wherein the first patterned spacer corresponds to the first protrusion and the second patterned spacer corresponds to the second protrusion,
    wherein the first protrusion has a first height and the second protrusion has a second height such that the first height is greater than the second height,
    wherein the first patterned spacer and the second patterned spacer have substantially a same height, such that the first patterned spacer contacts the first protrusion and the second patterned spacer is separated from the second protrusion,
    wherein the thin film transistor includes a gate electrode extending from the gate line, a gate insulating layer on the gate electrode, a semiconductor layer including an active layer and an ohmic contact layer on the gate insulating layer, and source and drain electrodes spaced apart from each other on the semiconductor layer,
    wherein the first protrusion includes a first layer, a second layer and a third layer such that the first layer is formed of a same layer as the active layer, the second layer is formed of a same layer as the ohmic contact layer, and the third layer is formed of a same layer as the source and drain electrodes,
    wherein the gate line has a first portion with a first width corresponding to the first and second protrusions and a second portion with a second width, the first width being greater than the second width, and wherein the second protrusion includes a single layer of a same layer as the active layer.

2. The LCD device according to claim 1, wherein the second patterned spacer is separated from the second protrusion by a gap less than about 0.3 μm.

3. The LCD device according to claim 1, wherein the first protrusion includes a triple-layered structure, and the second protrusion includes a single-layered structure.

4. The LCD device according to claim 1, wherein the first and second protrusions are arranged over the gate line.

5. The LCD device according to claim 1, further comprising a black matrix formed between the second substrate and the first patterned spacer and between the second substrate and the second patterned spacer, the black matrix corresponding to the gate and data lines.

6. The LCD device according to claim 1, further comprising a color filter layer formed between the second substrate and the first and second patterned spacers.

7. The LCD device according to claim 1, further comprising a common electrode on the first substrate, the common electrode being spaced apart from the pixel electrode.

8. The LCD device according to claim 1, wherein the data line includes a first layer, a second layer and a third layer such that the first layer is formed of a same layer as the active layer, the second layer is formed of a same layer as the ohmic contact layer, and the third is formed of a same layer as the source and drain electrodes.

9. The LCD device according to claim 5, further comprising a color filter layer formed between the black matrix and the first patterned spacer and between the black matrix and the second patterned spacer.

10. The LCD device according to claim 9, further comprising a common electrode formed between the color filter layer and the first patterned spacer and between the color filter layer the second patterned spacer.

11. The LCD device according to claim 10, further comprising an overcoat layer formed between the color filter layer and the common electrode.

* * * * *